United States Patent [19]

Mochizuki

[11] Patent Number: 5,188,974
[45] Date of Patent: Feb. 23, 1993

[54] METHOD OF MANUFACTURING SEMICONDUCTOR DEVICE

[75] Inventor: Chiori Mochizuki, Yokohama, Japan

[73] Assignee: Canon Kabushiki Kaisha, Tokyo, Japan

[21] Appl. No.: 747,486

[22] Filed: Aug. 19, 1991

Related U.S. Application Data

[63] Continuation of Ser. No. 470,406, Jan. 29, 1990, abandoned, which is a continuation of Ser. No. 264,083, Oct. 28, 1988, abandoned.

[30] Foreign Application Priority Data

Oct. 31, 1987 [JP] Japan .................. 62-276348

[51] Int. Cl.$^5$ .......................... H01L 21/265
[52] U.S. Cl. ........................ 437/40; 437/4;
   437/41; 437/51; 437/205; 148/DIG. 105
[58] Field of Search ............... 437/2, 3, 4, 51, 101,
   437/205, 83, 904, 40, 41; 148/DIG. 1, DIG.
   120, DIG. 105; 357/2, 30, 23.7; 156/648, 649;
   250/578.1, 208.1, 211 R

[56] References Cited

U.S. PATENT DOCUMENTS

| 4,405,915 | 9/1983 | Komatsu et al. | 357/30 K |
| 4,545,111 | 10/1985 | Johnson | 437/904 |
| 4,581,099 | 8/1986 | Fukaya et al. | 437/83 |
| 4,857,751 | 8/1989 | Hatanaka et al. | 250/208.1 |
| 4,931,661 | 6/1990 | Fukaya et al. | 250/578.1 |

FOREIGN PATENT DOCUMENTS

| 0190061 | 11/1983 | Japan | 357/2 |
| 0201461 | 9/1986 | Japan | 437/3 |

Primary Examiner—Brian E. Hearn
Assistant Examiner—Tuan Nguyen
Attorney, Agent, or Firm—Fitzpatrick, Cella, Harper & Scinto

[57] ABSTRACT

A method of manufacturing a semiconductor device having a photoconductive semiconductor layer formed on a substrate and a pair of electrodes formed on the semiconductor layer with an ohmic contact layer interposed therebetween, wherein the ohmic contact layer is removed after the etching process of the semiconductor layer.

9 Claims, 3 Drawing Sheets

METHOD OF MANUFACTURING SEMICONDUCTOR DEVICE

This application is a continuation of application Ser. No. 07/470,406 filed Jan. 29, 1990, now abandoned, which is a continuation of application Ser. No. 07/264,083 filed Oct. 28, 1988, now abandoned.

BACKGROUND OF THE INVENTION

1. Field of the Invention

The present invention relates to a method of manufacturing a semiconductor device, and more particularly to a semiconductor device manufacturing method suitable for use in manufacturing particularly a photoelectric conversion device wherein an insulating layer and a photoconductive semiconductor layer are formed in association with a photoelectric conversion region, a charge storage region for storing an output of the photoelectric conversion region, and a switch region connected to the charge storage region.

2. Related Background Art

Conventionally, as a reader system of a facsimile, with an image reduction optical system and a CCD sensor of semiconductor device has been used. Following the development of photoconductive semiconductor material, a typical example of which is amorphous silicon hydride (hereinafter abbreviated as a-Si:H), a so-called contact type line sensor of semiconductor device has been developed extensively, wherein a photoelectric conversion region and a signal processing region are formed on an elongated substrate to read an original document with an equal magnification optical system.

Particularly, an a-Si:H can be used not only as photoelectric converting material but also as semiconductor material of field effect transistors. Therefore, the photoconductive semiconductor layer of a photoelectric conversion region and the semiconductor layer of a driving element region (signal processing region) can be formed at the same time. Thus, it is possible to provide a photoelectric conversion device having a plurality of elements each having a photoelectric conversion region and a driving element region both formed integrally on the same substrate.

FIG. 1 is a partial cross sectional vertical view showing the structure of a line sensor as an example of a semiconductor device.

As shown in FIG. 1, there are formed on a substrate 1 a wiring region 2, photoelectric conversion region 3, charge storage region 4, and switch region 5. Formed on the substrate 1 are an underlying electrode wiring 6 in the wiring region 2, an underlying electrode wiring 7 in the charge storage region 4, and an underlying electrode wiring 8 serving as the gate electrode in the switch region 5. An insulating layer 9 is formed on these underlying electrode wiring layers 6, 7 and 8. A semiconductor layer (a-Si:H) 11 is formed on the insulating layer 9 in the switch region 5, whereas a photoconductive semiconductor layer (a-Si:H) 10 of photoconductive material is formed on the substrate 1 in the photoelectric conversion region 3. In this case, &he semiconductor layer 11 and photoconductive semiconductor layer 10 are formed at the same time.

A matrix wiring is formed between the underlying electrode wiring 6 and an overlying electrode wiring 12 with an insulating layer interposed therebetween. The photoconductive semiconductor layer 10 and the semiconductor layer 11 are connected by an overlying electrode wiring 13 which runs above the insulating layer 9 in the charge storage region 4. The overlying electrode wiring 13, insulating layer 9 and underlying electrode wiring 7 constitute a storage capacitor. A portion of the overlying electrode wiring 13 connected to one end of the semiconductor layer 11 serves as the drain electrode, and a portion of an overlying electrode wiring 14 connected to the other end of the semiconductor layer 11 serves as the source electrode.

The structure described above has the photoelectric conversion region and signal processing region on the same substrate. As shown in FIG. 1, the semiconductor layer is formed only in the photoelectric conversion region 3 and switch region 5. The insulating layer 9, and the photoconductive semiconductor layer 10 and semiconductor layer 11 on the insulating layer are formed by a film forming method such as glow discharge, and patterned by means of photolithography similar to the case of patterning the overlying and underlying electrode wirings.

FIG. 2 is a schematic plan view showing another example of a line sensor wherein although only two bit elements are shown, the actual line sensor has 1728 bits in total (corresponding to an A4 size readable length, with the density of 8 elements per mm).

FIG. 3 is a partial cross sectional vertical view of the line sensor shown in FIG. 2, wherein an n+ layer shown in FIG. 4E is omitted for the sake of brevity.

FIGS. 4A to 4E are schematic cross sectional vertical views along line A—A' of FIG. 2 showing conventional line sensor manufacturing steps. FIGS. 4D' and 4E' corresponding to FIGS. 4D and 4E are schematic cross sectional lateral views along line B—B' of FIG. 2.

FIGS. 4A to 4E' differ from FIG. 3 in that an n+ layer is shown and the insulating layer is removed from a wiring region 102.

The manufacturing method of the line sensor in FIG. 3 will be described with reference to FIGS. 4A to 4E'.

A glass substrate (manufactured by Corning Company Ltd. #7059) whose opposite sides were polished was washed in an ordinary manner using neutral detergent (or organic alkali based detergent).

Cr was deposited to the thickness of 500 Å by the sputter method. Al was then deposited to the thickness of 500 Å by the sputtering method.

A photoresist pattern of desired configuration was formed using a positive type photoresist (Tokyo Ohka NMD-3). Thereafter, an unnecessary portion of Al was etched using an etching liquid made of a mixture of phosphoric acid (85% in volume solution), glacial acetic acid and water with 16:1:2:1: in volume ratio.

Next, an unnecessary portion of Cr was etched using an aqueous solution of a mixture of ammonium cerium (IV) nitrate and perchloric acid, to thereby form underlying electrode wirings 106, 107 and 108 in wiring region 102, charge storage region 104 and transfer switch region 105, respectively (FIG. 4A).

Next, the glass substrate 100 was set in a capacitive coupling type glow discharge decomposer which was maintained at 230° C. and at a vacuum pressure of $1 \times 10^{-6}$ Torr. SiH$_4$ diluted to 10% with H$_2$ was introduced into the decomposer at a flow rate of 5 SCCM, and at the same time NH$_3$ was introduced therein at a flow rate of 20 SCCM. A glow discharge was effected for 2 hours at an RF discharge power 15 W using a high frequency power source at 13.56 MHz, to thus form an insulating layer 109 made of silicon nitride to the thickness of 0.3 micron. Next, $SiH_4$ was introduced at the flow rate of 10 SCCM and a glow discharge was effected for 5 hours at the discharge power 8 W and at a gas pressure 0.07 Torr, to thus form an amorphous silicon intrinsic layer 110 to the thickness of 0.50 micron. Subsequently, using as a raw material a gaseous mixture of $SiH_4$ diluted to 10% with $H_2$ and $PH_3$ diluted to 100 ppm with $H_2$ at a mixture ratio of 1:10, an ohmic contact n+ layer 115 was deposited to the thickness of 0.12 micron at a discharge power 30 W (FIG. 4B).

Next, a contact hole pattern was formed using a positive type photoresist (Tokyo Ohka NMD-3). Unnecessary portions of the n+ layer and amorphous silicon intrinsic layer were etched by means of the chemical dry etching method (CDE method) with $CF_4$ gas to thus form a contact hole 116. In this case, there is no need of selective etching among the n+ layer, photoconductive semiconductor layer and insulating layer. (FIG. 4C).

Next, Al was deposited to the thickness of 1.0 to 1.5 micron by the sputtering method, to form a conductive layer. Succeedingly, after forming a photoresist pattern of desired configuration, the exposed conductive layer was etched using an etching liquid made of a mixture of phosphoric acid (85% in volume solution), glacial acetic acid and water with 16:1:2:1 in volume ratio, to thus form an overlying electrode. Thereafter, the exposed n+ layer was dry etched by means of the reactive ion etching method (RIE method) with $CF_4$ gas, to thus form the n+ layer into a desired configuration (n+ etching process). Next, the photoresist was removed (FIGS. 4D and 4D').

Next, a photoresist pattern was formed for isolating each element.

Thereafter, unnecessary portions of the intrinsic semiconductor layer and insulating layer were dry etched by means of the RIE method with $CF_4$ gas. As a result, respective elements integrally coupled and electrically connected via the photoconductive semiconductor layer were made independent and separate (isolation process) and only the necessary electrode wirings were used for electrical connection. Next, the photoresist was removed (FIGS. 4E and 4E').

Next, a passivation film (not shown) was formed using silicon nitride by the CVD method, organic resin by coating method, or the like, to thus complete an optical sensor array.

In the line sensor of semiconductor device described above, the patterning of overlying electrode Al is performed through wet etching so that the resist pattern design takes a side etching amount into consideration. However, since the following process of etching the n+ layer is performed by the RIE method, i.e., anisotropic etching, if the resist pattern for the Al patterning is used as a mask, the design values are not satisfied sufficiently. Thus, in a semiconductor device requiring a highly densed pattern, a problem associated with a sensor characteristic may occur.

SUMMARY OF THE INVENTION

It is an object of the present invention to provide a method of manufacturing a semiconductor device having a photoconductive semiconductor layer formed on a substrate and a pair of electrodes formed on the semiconductor layer with an ohmic contact layer interposed therebetween, wherein the ohmic contact layer is removed after the etching process of the semiconductor layer.

It is another object of the present invention to provide a method of patterning an n+ layer capable of satisfying the design values, by changing the order of the n+ etching process and the isolation process.

It is a further object of the present invention to provide a photoelectric conversion device manufactured by the above method which can provide a uniform characteristic of each element and a large S/N ratio.

BRIEF DESCRIPTION OF THE DRAWINGS

FIGS. 4D' and 4E' corresponding to FIGS. 4D and 4E are the schematic cross sectional lateral views;

FIGS. 5D' and 5E' corresponding to FIGS. 5D and 5E are the schematic cross sectional lateral views.

DETAILED DESCRIPTION OF THE PREFERRED EMBODIMENTS

A preferred embodiment of the present invention will be described below. It is to be understood that the present invention is not limited to the embodiment only, but the invention is applicable to other modifications which achieve the above objects.

According to the present invention, after forming a semiconductor layer on a substrate and forming a plurality of pairs of electrodes with an ohmic contact layer on the semiconductor layer interposed therebetween, an element isolation process to remove the semiconductor layer except the necessary portions by means of dry etching such as reactive ion etching, chemical ion etching or the like using, for example, a gas such as $CF_4$, $CHF_3$, $CCl_2F_2$, $CF_3Br$, $CF_4+Cl_2$, $CF_4'O_2$, and $CF_4'H_2$. Thereafter, by removing the exposed ohmic contact layer by the etching method similar to the above, active regions of functional element such as the gap in photoelectric conversion region and/or the switch region, the channel and the like are formed.

The invention is also properly applied to the method of manufacturing a photoelectric conversion device as described in the following Example.

Example

Figure 1:
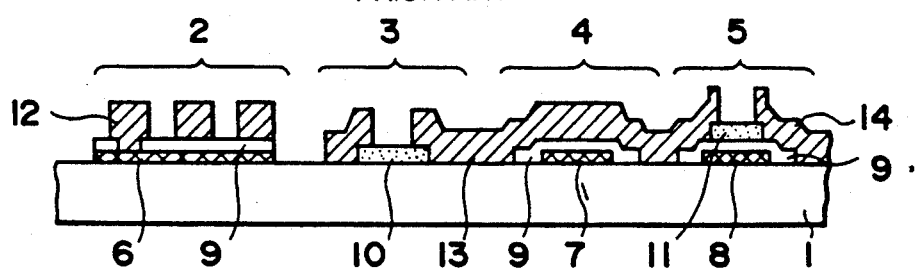
FIG. 1 is a schematic cross sectional vertical view showing the structure of a line sensor to which the present invention is applicable.
Figure 2:
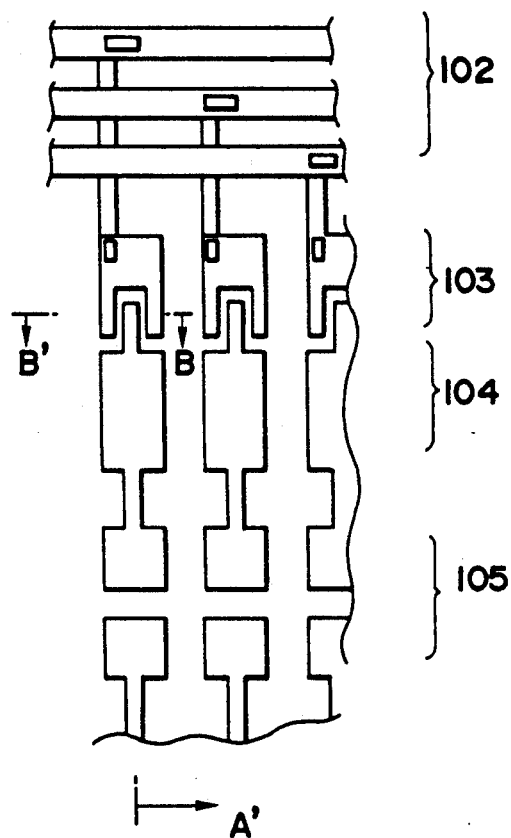
FIG. 2 is a schematic cross sectional vertical view showing the structure of another line sensor to which the present invention is applicable.
Figure 3:
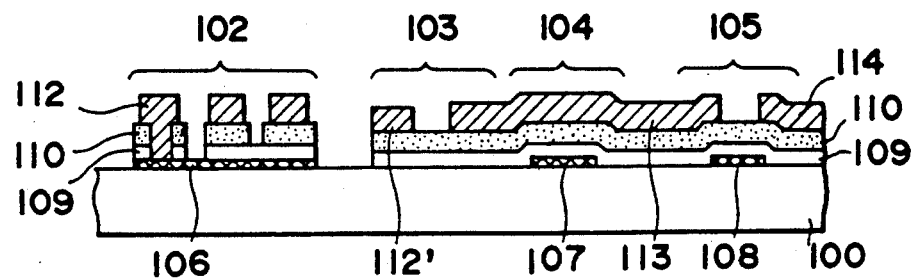
FIG. 3 is a schematic cross sectional view showing the line sensor shown in FIG. 2.
Figure 4A:
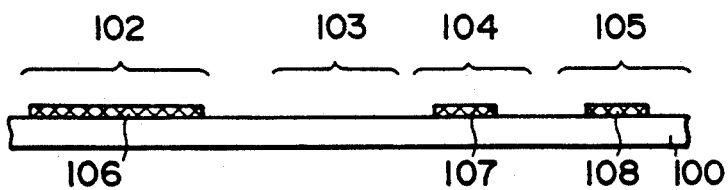
FIGS. 4A to 4D are schematic cross sectional vertical views showing the conventional processes of manufacturing the line sensor shown in FIG. 2.
Figure 4B:
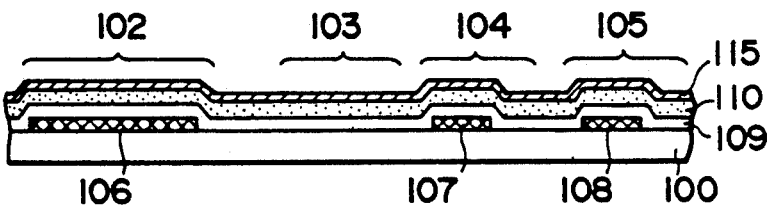
Figure 4C:
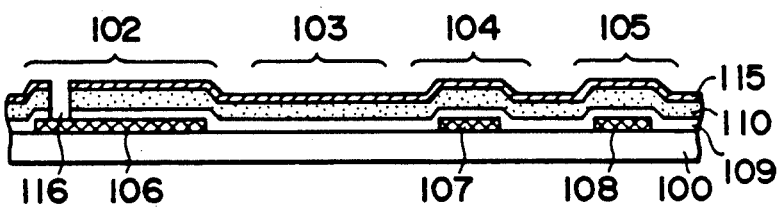
Figure 4D:
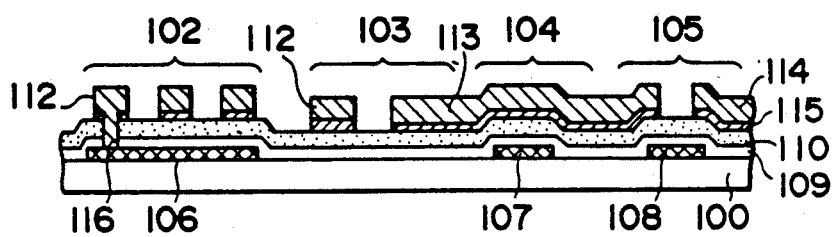
Figure 4E:
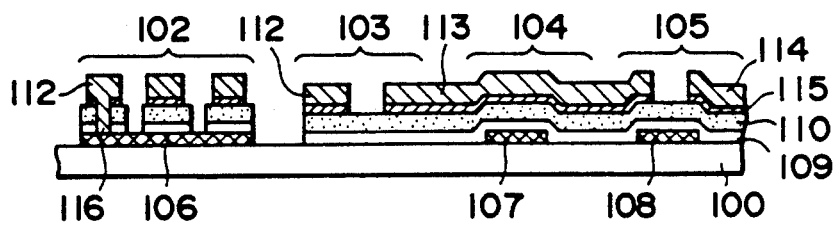
Figure 4D:
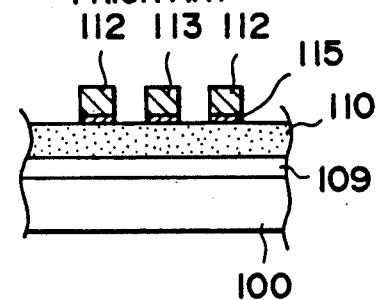
Figure 4E:
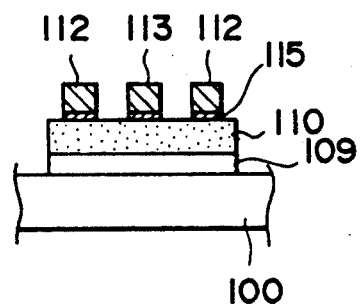
Figure 5A:
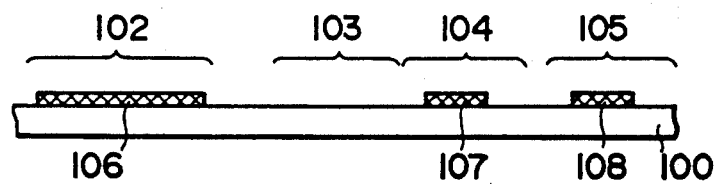
FIGS. 5A to 5E are schematic cross sectional vertical views showing the method of manufacturing the line sensor shown in FIG. 2 according to the present invention.
Figure 5B:
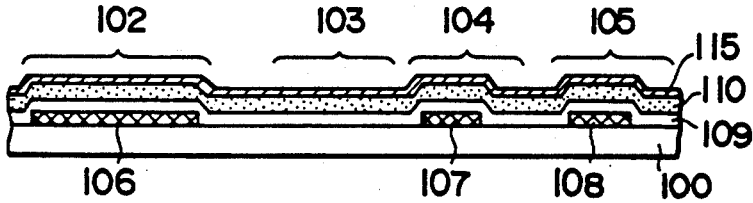
Figure 5C:
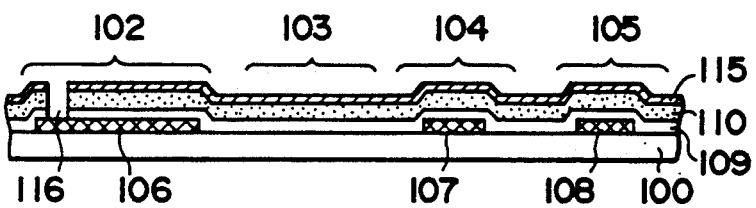
Figure 5D:
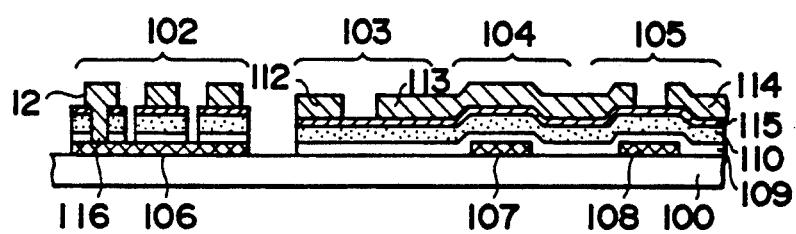
Figure 5E:
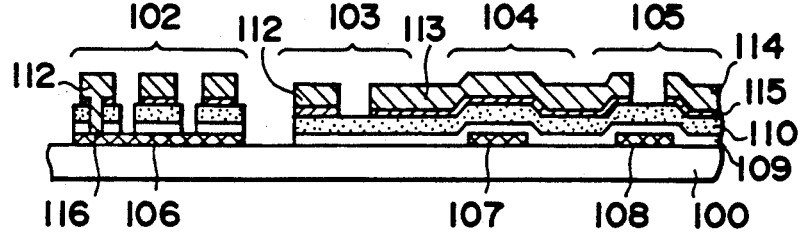
Figure 5D:
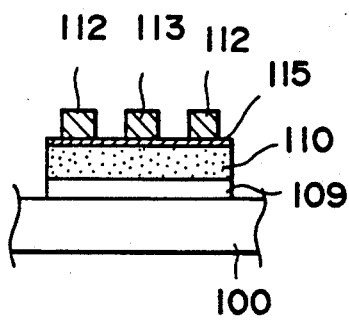
Figure 5E:
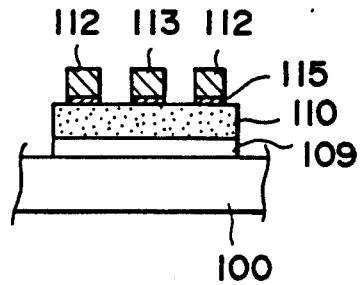

FIGS. 5A to 5E are schematic cross sectional vertical views showing the steps of manufacturing an optical line sensor array according to the present invention. FIGS. 5D' and 5E' corresponding to FIGS. 5D and 5E are schematic cross sectional vertical views.

A glass substrate (manufactured by Corning Company Ltd. #7059) whose opposite sides were polished was washed in an ordinary manner using neutral detergent (or organic alkali based detergent).

Cr was deposited to the thickness of 500 Å by the sputtering method. Al was then deposited to the thickness of 500 Å by the sputter method.

A photoresist pattern of desired configuration was formed using a positive type photoresist (Tokyo Ohka NMD-3). Thereafter, an unnecessary portion of Al was etched using an etching liquid made of a mixture of phosphoric acid (85% in volume solution), glacial acetic acid and water with 16:1:2:1 in volume ratio.

Next, an unnecessary portion of Cr was etched using an aqueous solution of a mixture of ammonium cerium (IV) nitrate and perchloric acid, to thereby form underlying electrode wirings 106, 107 and 108 in wiring region 102, charge storage region 104 and transfer switch region 105, respectively (FIG. 5A).

Next, the glass substrate 100 was set in a capacitive coupling type glow discharge decomposer which was maintained at 230° C. and at a vacuum pressure of $1 \times 10^{-6}$ Torr. SiH$_4$ diluted to 10% with H$_2$ was introduced into the decomposer at a flow rate of 5 SCCM, and at the same time NH$_3$ was introduced therein at a flow rate of 20 SCCM. A glow discharge was effected for 2 hours at an RF discharge power 15 W using a high frequency power source at 13.56 MHz, to thus form an insulating layer 109 made of silicon nitride to the thickness of 0.3 micron. Next, SiH$_4$ was introduced at the flow rate of 10 SCCM and a glow discharge was effected for 5 hours at the discharge power 8 W and at a gas pressure 0.07 Torr, to thus form an amorphous silicon intrinsic layer 110 to the thickness of 0.50 micron. Subsequently, using as a raw material a gaseous mixture of SiH$_4$ diluted to 10% with H$_2$ and PH$_3$ diluted to 100 ppm with H$_2$ at a mixture ratio of 1:10, an ohmic contact n+ layer 115 was deposited to the thickness of 0.12 micron at a discharge power 30 W (FIG. 5B).

Next, a contact hole pattern was formed using a positive type photoresist (Tokyo Ohka NMD-3). Unnecessary portion of the n+ layer and amorphous silicon intrinsic layer were etched by means of the chemical dry etching method (CDE method) with CF$_4$ gas to thus form a contact hole 116. In this case, there is no need of selective etching among the n+ layer, photoconductive semiconductor layer and insulating layer (FIG. 5C).

Next, Al was deposited to the thickness of 1.0 to 1.5 micron by the sputtering method, to form a conductive layer. Succeedingly, after forming a photoresist pattern of desired configuration, the exposed conductive layer was etched using an etching liquid made of a mixture of phosphoric acid (85% in volume solution), glacial acetic acid and water with 16:1:2:1 in volume ratio, to thus form an overlying electrode. Thereafter, the unnecessary portions of the intrinsic semiconductor layer and insulating layer were dry etched by means of the reactive ion etching method (RIE method) with CF$_4$ gas. As a result, respective elements integrally coupled and electrically connected via the photoconductive semiconductor layer were made independent and separate (isolation process) and only the necessary electrode wirings were used for electrical connection. Next, the photoresist was removed (FIGS. 5D and 5D').

Next, as shown in FIGS. 5E and 5E', using the overlying electrode pattern as a mask, the exposed n+ layer was etched by the RIE method, to thus form the gap in the photoelectric region 3 and the channel of the transfer transistor in the switch region 5.

Next, a passivation film (not shown) was formed using silicon nitride by the CVD method, organic resin by coating method, or the like to thus complete an optical sensor array.

As described so far, according to the method of manufacturing a semiconductor device of this invention, the pattern for etching the n+ layer can be formed within the allowance of design values. According to the method of manufacturing a photoelectric conversion device of this invention, the isolation step which takes a longer etching time than that of the n+ layer etching is carried out first so that partial damage, if any, of the gap in the photoelectric conversion region and the channel of the transfer transistor can be removed at the next n+ layer etching process, to thus allow a more stable sensor characteristic.

Since respective elements have already been isolated during the n+ layer etching process, voltage withstanding between elements and of elements becomes great and the electrical corrosion can be prevented because of the side wall effect (deposition of fluoride on the wall) during the n+ layer etching process.

As above, according to the present invention, the sensor characteristic satisfying the design values becomes possible, and a highly densed patterning can be easily realized.

What is claimed is:

1. A method for manufacturing a semiconductor device on a substrate, said semiconductor device including a plurality of semiconductor elements having a semiconductor region and a pair of electrodes disposed on said semiconductor region through an ohmic contact region disposed on said semiconductor region, comprising the sequential steps of:

forming a semiconductor layer on said substrate, an ohmic contact layer on said semiconductor layer, and a conductive layer on said ohmic contact layer;

removing a portion of said conductive layer, whereby said pair of electrodes are formed on said ohmic contact layer;

removing a portion of said semiconductor layer and said ohmic contact layer to isolate each of said plurality of semiconductor elements;

removing a portion of said ohmic contact layer between said pair of electrodes by utilizing said pair of electrodes as a mask.

2. A method of manufacturing a semiconductor device according to claim 1, wherein said ohmic contact layer is patterned using said electrodes as a mask.

3. A method of manufacturing a semiconductor device according to claim 1, wherein said semiconductor layer is made of amorphous silicon hydride.

4. A method of manufacturing a semiconductor device according to claim 1, wherein said semiconductor layer and/or said ohmic contact layer is removed by a reactive ion etching method.

5. A method for manufacturing a semiconductor device according to claim 1, wherein said semiconductor element is a photosensor.

6. A method for manufacturing a semiconductor device according to claim 1, wherein said semiconductor element is a transistor.

7. A method for manufacturing a semiconductor device on a substrate, said semiconductor device including a plurality of semiconductor elements having a first semiconductor layer and a pair of electrodes disposed on said first semiconductor layer through a second semiconductor layer having a lower resistivity than said first semiconductor layer, comprising the sequential steps of:

forming a first semiconductor layer on said substrate;

forming a second semiconductor layer on said first semiconductor layer; and forming a conductive layer on said second semiconductor layer;

removing a portion of said conductive layer, whereby said pair of electrodes are formed on said second semiconductor layer;

removing a portion of said first semiconductor layer and said second semiconductor layer to isolate each of the plurality of semiconductor elements; and removing a portion of said second semiconductor layer between said pair of electrodes by utilizing said pair of electrodes as a mask.

8. A method for manufacturing a semiconductor device according to claim 7, wherein said semiconductor element is a photosensor.

9. A method for manufacturing a semiconductor device according to claim 7, wherein said semiconductor element is a transistor.

* * * * *

UNITED STATES PATENT AND TRADEMARK OFFICE
CERTIFICATE OF CORRECTION

PATENT NO. : 5,188,974
DATED : February 23, 1993
INVENTOR(S) : CHIORI MOCHIZUKI

It is certified that error appears in the above-identified patent and that said Letters Patent is hereby corrected as shown below:

COLUMN 1

Line 23, "facsimile," should read --facsimile, image scanner and the like, an image reader provided--.
Line 46, "cross sectional" should read --cross-sectional--.
Line 62, "&he" should read --the--.

COLUMN 2

Line 27, "cross sectional" should read --cross-sectional--.
Line 30, "cross sectional" should read --cross-sectional--.
Line 33, "cross" should read --cross- --.
Line 45, "sputter" should read --sputtering--.

COLUMN 4

Line 11, "cross sectional" should read --cross-sectional--.
Line 14, "cross sectional" should read --cross-sectional--.
Line 17, "cross sectional" should read --cross-sectional--.
Line 19, "cross sectional" should read --cross-sectional--.
Line 23, "cross sectional" should read --cross-sectional--.
Line 24, "cross sectional" should read --cross-sectional--.
Line 29, "cross sectional" should read --cross-sectional--.
Line 46, "$CF_4'O_2$," should read --$CF_4+O_2$,-- and "$CF_4'H_2$." should read --$CF_4+H_2$.--.
Line 57, "cross sectional" should read --cross-sectional--.
Line 62, "cross sectional" should read --cross-sectional--.
Line 68, "sputter" should read --sputtering--.

UNITED STATES PATENT AND TRADEMARK OFFICE
CERTIFICATE OF CORRECTION

PATENT NO. : 5,188,974
DATED : February 23, 1993
INVENTOR(S) : CHIORI MOCHIZUKI

Page 2 of 2

It is certified that error appears in the above-identified patent and that said Letters Patent is hereby corrected as shown below:

COLUMN 5

Line 35, "portion" should read --portions--.
Line 45, "Succeedingly," should read --Subsequently,--.
Line 63, "photoelectric region 3" should read --photoelectric region 103--.
Line 64, "switch region 5." should read --switch region 105.--.

COLUMN 6

Line 39, "elements;" should read -elements; and--.
Line 44, "of" should read --for--.
Line 47, "of" should read --for--.
Line 50, "of" should read --for--.

Signed and Sealed this

Eighth Day of February, 1994

Attest:

BRUCE LEHMAN

Attesting Officer

Commissioner of Patents and Trademarks